United States Patent [19]

Himes

[11] Patent Number: 5,614,264
[45] Date of Patent: Mar. 25, 1997

[54] FLUID DELIVERY APPARATUS AND METHOD

[75] Inventor: Ricky A. Himes, Boalsburg, Pa.

[73] Assignee: Atotech USA, Inc., State College, Pa.

[21] Appl. No.: 514,313

[22] Filed: Aug. 11, 1995

[51] Int. Cl.[6] .................................................. B05D 7/00
[52] U.S. Cl. ......................... 427/424; 427/421; 118/314;
118/315; 118/316; 134/64 R; 134/122 R;
134/199; 34/380; 34/656
[58] Field of Search ................................. 427/424, 421;
134/64 R, 122 R, 199; 34/380, 656; 188/316,
314, 315

[56] References Cited

U.S. PATENT DOCUMENTS

| | | | |
|---|---|---|---|
| 3,734,109 | 5/1973 | Hebner | 134/64 |
| 3,776,800 | 12/1973 | Goffredo et al. | 156/345 |
| 3,871,914 | 3/1975 | Goffredo et al. | 134/109 |
| 3,905,827 | 9/1975 | Goffredo et al. | 134/13 |
| 3,935,041 | 1/1976 | Goffredo et al. | 156/18 |
| 4,017,982 | 4/1977 | Goffredo | 34/31 |
| 4,137,988 | 2/1979 | Croix-Marie | 180/130 |
| 4,174,261 | 11/1979 | Pellegrino | 204/273 |
| 4,202,073 | 5/1980 | Hughes | 15/306 |
| 4,270,317 | 6/1981 | Kurie | 51/426 |
| 4,557,785 | 12/1985 | Ohkuma | 156/345 |
| 4,576,685 | 3/1986 | Goffredo et al. | 204/30 |
| 4,789,405 | 12/1988 | Blasing et al. | 134/1 |
| 4,854,004 | 8/1989 | Omata et al. | 15/304 |
| 5,063,951 | 11/1991 | Bard et al. | 134/64 R |
| 5,289,639 | 3/1994 | Bard et al. | 34/12 |

*Primary Examiner*—Shrive Beck
*Assistant Examiner*—David M. Maiorana
*Attorney, Agent, or Firm*—Paul & Paul

[57] ABSTRACT

A fluid delivery apparatus and method is provided wherein either liquid or gaseous fluid is provided from fluid dispenser manifolds, via nozzle plates associated therewith, on each side of a path of travel of articles being treated by the fluid, and wherein nozzle openings in a nozzle plates cooperate with transverse groove(s) to provide a screen flow of fluid extending transversely of the path of travel of articles, and directed toward the articles. In the case of the fluid being a liquid, the nozzle openings provide cylindrical filament-like columns of liquid which are rendered by the associated grooves into generally flat, transversely disposed semen spray of liquid. In the case of the fluid being a gas, the nozzle openings and transverse grooves cooperate to deliver the gas in transversely spaced apart, transverse, planar zones of gas directed toward the path of article travel.

In the case of liquid flow, the openings are generally cylindrical, and in the case of gas flow the openings are generally spaced-apart slotted holes. In the cases of both liquid and gas fluids, one of the grooves and/or nozzles are directed upstream relative to the path of article flow. Various adjustments are provided for adjusting the positions of the nozzle plates relative to the path of flow.

34 Claims, 5 Drawing Sheets

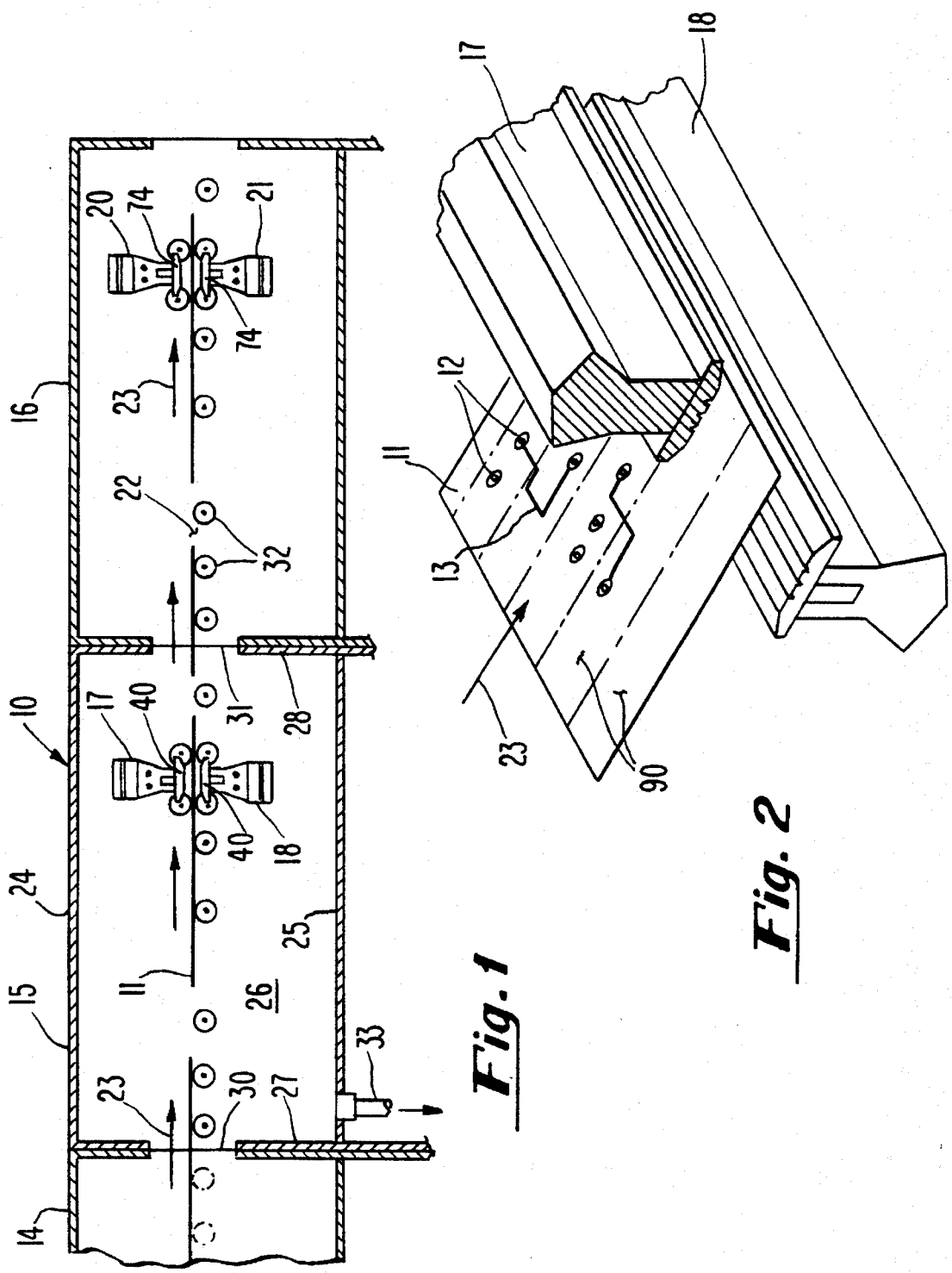

FLUID DELIVERY APPARATUS AND METHOD

BACKGROUND OF THE INVENTION

In various wet processing arts involving chemical treatment, such as etching, electroplating and the like, it is known to deliver fluids onto surfaces of articles being treated. In many instances, the articles being treated are printed circuit boards and the like. Often such articles are being delivered along a generally horizontal path and are etched, cleaned, rinsed, activated, dried, coating, etc., at various stations along the path. Sometime the articles being treated, if they are printed circuit board, have bore holes extending therethrough and it is desired to have the treatment fluid impinge not only on upper and lower surfaces of the boards, but also on bore holes. The treatment of the articles can take place via nozzle arrangements, such as that set forth in U.S. Pat. No. 4,789,405, for example. In other instances the treatments may take the form of various other fluid delivery, spraying, drying techniques, such as those disclosed in U.S. Pat. Nos. 4,576,685, 4,017,982, 3,935,041, 3,905,827, or 3,776,800. Various drive techniques for driving the printed circuit boards or other articles through the various treatment stations may be used, such as those set forth in U.S. Pat. No. 4,046,248 or the like.

Accordingly, the technical field of this invention is directed to a method and arrangement for treating conductor substrates. Such treatment processes can include the removal of liquid from through-holes in conductors boards and from its surface, drying the boards, in addition to cleaning, coating, rinsing, etching, activation and various electrolytic processes.

The present invention is directed toward efficient delivery of fluid to articles being treated, and most particularly to conductor boards and the like.

In connection with the fluid delivery, slotted tubes, for example have been used, but such are limited in development of the flow upon exiting the orifice or slot, such that the flow stream may dissipate more quickly and lose some of its momentum, even exponentially, as the distance from the substrate being treated increases.

Spray nozzles are also use, but such often require large amounts of energy relative to the fluid medium being processed. Additionally, in some instances spray nozzles do not provide the desired level of uniformity in terms of coverage, with a higher percentage of flow and pressure being located at the center of the nozzle spray pattern, and a lesser percentage of flow and pressure outwardly thereof, in that flow and pressure are often substantially reduced as the distance is increased perpendicular to the centerline of the nozzle.

Fluid jet injectors have also been used to produce tight columns of flow, but also generally fail to provide a desired level of uniform and complete coverage of the article being treated. Additionally, small injectors require substantially higher pressure to maintain a desired impact of force on the article being treated, which high force impact may not always be desirable.

SUMMARY OF THE INVENTION

The present invention provides a method and apparatus for delivering a fluid to printed circuit boards or other articles being treated, as the articles are delivered along a path of travel, by impinging the fluid on the articles from both sides of their path of travel. During such travel fluid is dispensed from nozzles and directed via the nozzles themselves and grooves that connect the nozzles, such that the fluid is provided in the form of a transverse extended screen-like fluid flow from the nozzle openings. The fluid delivered may be either liquid or gas. In the case of a liquid, the nozzle openings disseminate the flow into cylindrical filament-like columns of liquid flow, connected via the grooves, whereby at the orifice formed at the junction of the cylindrical nozzles and groove, the liquid flow is transformed into a generally flat transversely disposed, planar screen spray of liquid. In the case of a gas fluid, such is provided via nozzle openings and transverse grooves connecting rows of openings, which openings are transversely spaced apart to facilitate disseminating from the openings via the grooves separate, spaced-apart, transversely aligned planar zones of gas flow directed toward the path of article travel. A suction effect is created by an upstream-converging surface of the nozzle, which may be optimized by the configuration of the lower surface of the nozzle.

Various adjustments are provided for the apparatus in accordance with this invention. Additionally, various preferred parameters and structural arrangements are utilized. In some cases a row of nozzle openings is directed at an angle to the path of travel, aimed at the upstream direction of the path of travel.

Accordingly, it is a primary object of this invention to provide a novel method and apparatus for imparting fluid delivery to an article being conveyed along a predetermined path.

It is a further object of this invention to accomplish above object, wherein the fluid delivery is gas for drying an article, such as a conductor board.

It is another object of this invention to accomplish the primary object wherein the fluid delivery is a liquid fluid delivery, such as for rinsing, etching, etc.

Other objects and advantages will be readily understood upon a reading of the following brief description of the drawings, detailed description of the preferred embodiments and the appended claims.

BRIEF DESCRIPTION OF THE DRAWINGS FIGURES

FIG. 1 is a longitudinal sectional, schematic view, taken through a multi-station apparatus in accordance with this invention, wherein a plurality of etching, rinsing, drying, operations are illustrated, and wherein means for imparting fluid delivery above and below articles such as circuit conductors, are illustrated.

FIG. 2 is a schematic, perspective view of a circuit board conductor being delivered along its path between upper and lower fluid dispensers in accordance with this invention, with the dispensers being of a type illustrated above and below the path of travel in FIG. 1.

FIG. 6 is a view similar to that of the liquid dispensing nozzle plate of FIG. 4, but with the nozzle plate of FIG. 6 being specifically adapted for gas dispensing, such as drying air or the like.

DETAILED DESCRIPTIONS OF THE PREFERRED EMBODIMENTS

Figure 3:
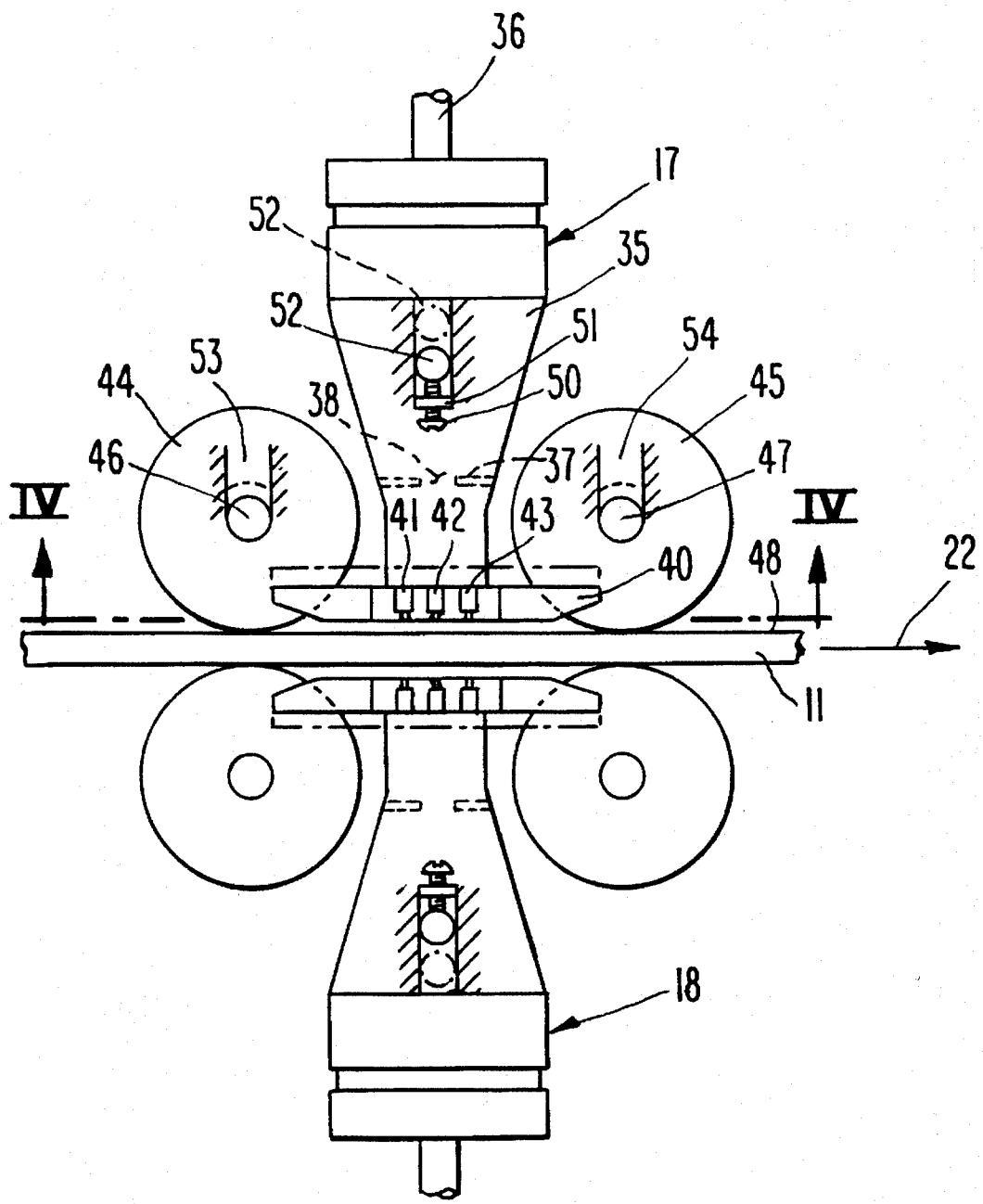
FIG. 3 is an enlarged view of upper and lower fluid delivery manifolds as shown in FIG. 1, with delivery plates thereof being shown in full lines close to the path of article travel, and in phantom lines spaced moreso from the path of articles travel.

Referring now to the drawings now in detail, reference is first made to FIG. 1, in which a fluid treatment system for articles being conveyed is generally designated by the numeral 10. In this embodiment, the articles being conveyed are printed circuit boards or the like 11, with through-holes such as 12 extending there through, with connecting portions 13 functioning as conductors along portions of the boards, as shown in FIG. 2.

In FIG. 1, a plurality of stations 14, 15 and 16 are illustrated, with station 14 functioning perhaps as an etching chamber wherein a suitable etchant may be dispensed onto appropriate surfaces of a printed circuit board or the like, followed perhaps by a rinsing station 15, in which the ecthant liquid (or other treatment fluid) would be rinsed from the articles 11 by means of fluid dispensers 17, 18, followed by passage of the articles into another station 16, which may for example be a gas treatment station such as an air drying station wherein air is dispensed via dispensers 20, 21 which, like the dispensers 17, 18, are disposed on opposite sides of a path of travel 22 for articles being conveyed through the apparatus of the system 10, as shown, from left to right, in the direction of the arrows 23.

Each of the stations 14–16 are provided with upper and lower walls, 24, 25, side walls 26, inlet and outlet walls 27, 28 with appropriate inlet and outlet openings 30, 31, respectively.

The path 22 of travel of the articles 11 is therefore a longitudinal path of travel through the machine and in the embodiment shown, the path 22 is generally horizontal.

Appropriate drive rollers 32 are provided, generally shaft-mounted on transversely disposed shafts, which in turn are driven by any suitable means, such as a drive means for example as shown in U.S. Pat. No. 4,015,706.

In instances particularly where the treatment fluid in a given station is liquid, such as for the station 15, an appropriate liquid discharge line 33 may be provided, for discharge for recycling or the like, as desired.

With reference to FIG. 2, in particular, the article 11 is shown being delivered substantially horizontally in the direction of arrow 23, beneath a dispenser 17 and above a dispenser 18, it being understood that FIG. 2 could equally well represent dispensers 20, 21 as desired.

With reference to FIG. 3, it will be seen that the upper dispenser 17 is disposed above the lower dispenser 18 for conveyance of articles 11 therebetween in a longitudinal, generally horizonal path of travel, as shown.

The dispenser 17 includes a manifold 35 which receives treatment liquid via a inlet tube 36 or the like, for delivery down through the manifold 35, through a manifold transition plate 37 having a large number of spaced apart transition holes 38 therein, arranged in a row, which extends transversely, substantially between sidewalls 26 of the apparatus as shown in dotted lines in FIG. 3. The fluid thus delivered via conduit 36 and manifold transition holes 38 is thus delivered to a multi-port fluid dispenser nozzle plate 40. The nozzle plate has a plurality of fluid dispenser nozzle openings 41, 42 and 43, arranged in transverse rows, perpendicular to the longitudinal path of travel 22 for articles 11, and extending generally the transverse length of the manifold 17, substantially completely between opposed sidewalls 26 of the apparatus.

A pair of article-engaging rollers 44, 45 are provided, carded indirectly (by means not shown) by the dispenser 17, respectively shaft-mounted at 46, 47, to engage against an upper surface 48 of an article 11 being treated. The purpose of the upper and lower rollers 44, 45 is to resist the forces of impingement of fluid being delivered to an article 11 being treated via a manifold on the opposite side of the path of travel 22. Thus, fluid delivered via lower dispenser 18 would impart an upward component of motion to the article 11 being treated as shown in FIG. 3, but for the resistance applied by the rollers 44, 45 in engagement with an upper surface 48 of the article 11. Conversely, fluid delivered from upper dispenser 17 onto an upper surface 48 of the article 11, would be resisted by the presence of lower rollers (unnumbered) carried by the dispenser 180

In order to accommodate different thicknesses of article 11, the dispensers 17, 18, are vertically adjustable by any suitable means, such that their dispenser nozzle plates 40 may move, for example, between the full line positions therefor shown in FIG. 3, to the phantom line positions shown therefor, for accommodating, for example, a thicker article 11, while still maintaining a desired predetermined small spacing between the surface of the plate 40 (for example the lower surface thereof as shown in FIG. 3) and the adjacent surface of the article 11 (for example, the upper surface 48 as shown in FIG. 3).

The means for adjusting the positions of the dispensers 17, 18 toward and away from the path 22 of article travel can be any suitable means. A representative means is shown whereby an adjustable positionable member 50 is threadedly mounted through a fixed plate member 51, to support transversely extending posts 52 at opposite transverse ends of the dispenser 17, whereby turning the threaded member 50 may move the dispenser 17 from the full line position shown for the post 52 in FIG. 3, to the phantom line position shown therefor also in FIG. 3, for movement of the plate 40 between the full line and phantom positions described above. It will be understood that any suitable adjustment means may be provided for changing the relative positions of the dispensers.

In the case where the path of travel 22 is a substantially horizontal path as shown, and wherein the rollers 44, 45 for the upper manifold engage an upper surface 48 of articles 11 being treated, the weight of the rollers 44, 45 may be used to provide the hold-down of the article 11 being treated in resisting upwardly directed flow from the dispenser 18. In such an instance, the shafts, 46, 47 for the rollers 44, 45, respectively, may be mounted in vertical slotted holes 53, 54, as shown.

Figure 4:
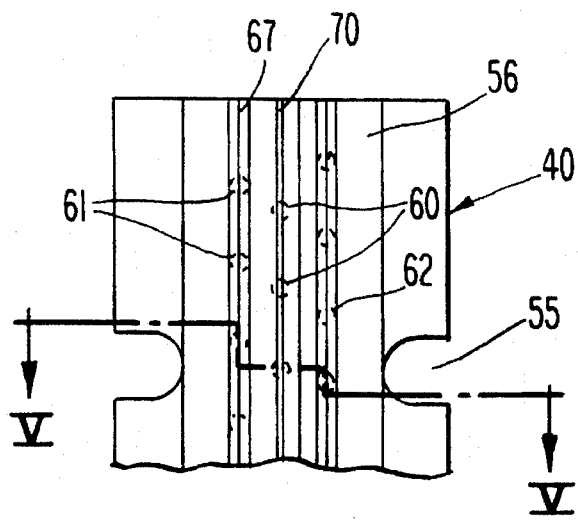
FIG. 4 is a view taken generally along the line of IV—IV of FIG. 3, showing the lower end of a nozzle plate surface of an upper dispenser, fragmentally illustrated.

Also, it will be noted, with reference to FIG. 4 that a plurality of spaced apart notches 55, spaced generally along the plates 40 between sidewalls 26, may accommodate rollers, 44, 45, passing therethrough, as shown in FIG. 3, with clearance, so as not to engage portions of the plate 40 defined by the notches 55. Such allows close placement of the rollers 44, 45 to the openings 41, 42 and 43 and similar openings on the opposite (lower) side of the path of travel 22 in the nozzle plate of the dispenser 18.

It will be apparent from FIG. 3 that the construction, operation, adjustment, etc. of the dispenser 18 is substantially the same as that of 17, so the description thereof will not be duplicated herein. However, with the operation of the dispensers above and below the path 22 of article travel, it would generally not be necessary to provide slotted holes such as those 53 and 54 for facilitating (upward or downward) vertical movement of the posts that mount the lower rollers therein; that the phenomena described above with respect to the upper rollers 44, 45 and their ability to move upward in slotted holes 53, 54, is a function of utilizing gravity to assure contact of the upper rollers on the upper surface 48 of the article 11.

It will also be apparent that, except for the details of discharge of fluid through the nozzle plates, the dispensers 20, 21 will generally be constructed similar to and mounted similarly to, the dispensers 17 and 18 such that the description provided above for the dispenser 17 applies equally well here too.

With reference to the illustration for the nozzle plate 40 illustrated in FIG. 4, it will be seen that the plate 40 while being shown fragmentally cut-off at the lower end thereof, actually extends substantially completely between sidewalls 26 of the apparatus.

The plate 40 is shown to have upper and lower surfaces 55, 56, with chamferred upstream and downstream lower surface portions 57 and 58, respectively. The chamferred surface portion 57 facilitates article inlet between a pair opposing plates 40, and the chamferred surface 58 facilitates air inlet into the partial vacuum created by an eduction effect caused by the forward or upstream directed flow from angled nozzles 60 located in rows between straight nozzles 61, 62 as will be discussed in more detail hereinafter. Such eduction of air would be in the direction indicated by the arrow 63 in FIG. 5 to fill the partial vacuum created by liquid being discharged via angled nozzles 60, and to facilitate the flow of liquid 60 across the upper surface of a printed circuit board or other article being conveyed from an upstream direction to a downstream direction, pursuant to arrow 64 in FIG. 5.

Figure 5:
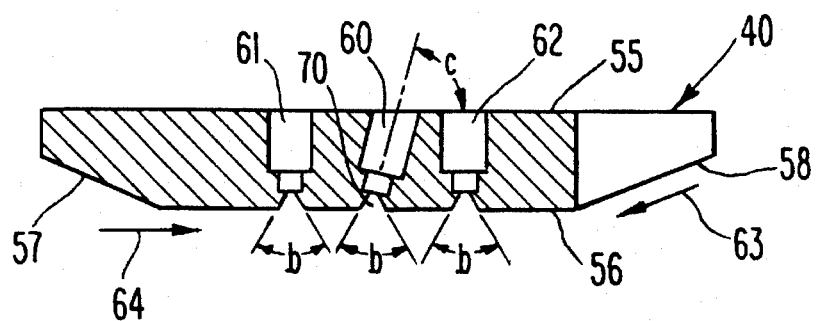
FIG. 5 is a longitudinal section taken generally along the line V—V of FIG. 4, wherein two generally perpendicularly disposed nozzles are illustrated, with an angled nozzle being illustrated, disposed therebetween.
Figure 5A:
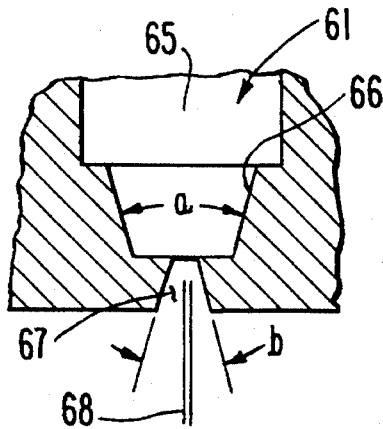
FIG. 5A is an enlarged detailed view of one of the nozzles and its associated groove illustrated in FIG. 5, wherein the geometric arrangement thereof is more clearly shown.

The nozzles 61, it will seen, are arranged in a row extending transversely of the longitudinal path of travel, and are oriented generally perpendicular to the longitudinal path of travel 22. Each nozzle 61 in the row is comprised of a larger diameter cylindrical blind hole zone 65 at the upper end, which joins a cylindrical tapered zone 66, therebeneath, which in turn communicates with a transverse groove 67. The transverse groove runs completely along the lower surface 56 of the plate 40, connecting the nozzle openings of nozzle zone 66, as shown in FIG. 4. The cylindrical taper "a" of zone 66 is in the range of 100° to 160° across its diameter, and most preferably is approximately 120°. The transverse groove 67 has an included angle "b" as shown in FIG. 5A, within the range of 30° to 90°, and most preferably is approximately 60°.

The pressure applied to the liquid being disseminated via nozzle 61 and the spacing apart of the nozzles 61 are selected to develop the flow of liquid emanating from the group of nozzles 61 in the transverse row shown, to produce from the nozzles 61 a generally cylindrical filament-like column 68 of liquid, with the groove 67 connecting a plurality of small columns of liquid into a generally flat, transversely disposed, planar screen spray of liquid, such that the groove 67 facilitates a fan spray of liquid from the individual nozzles 61 into a screen as described.

Preferably, in addition to the row of nozzles 61, there is an identical, or substantially identical row of nozzles 62 disposed downstream thereof, also downstream of angled nozzles 60 as will hereinafter be described. Each nozzle 60 is generally similar to the nozzle 61 having a blind bore like that 65 for the nozzle 61, which meets a cylindrical taper at the lower end thereof, which in turn meets a connecting groove 70, connecting a plurality of nozzles 60, forming an orifice, except that the connecting groove 70 and the several zones of the nozzles 60 are angled for liquid discharge in an upstream direction, at an angle "c" to the horizontal as shown in FIG. 5, which angle is preferably about 75°. It will be noted that it is the upstream directed spray via nozzles 60 that create the partial vacuum for flow of air in the direction of 63, for facilitating dissemination of liquid from the nozzles 60, 61 and 62 in an upstream direction or against the direction of flow of articles along their path.

Figure 6:
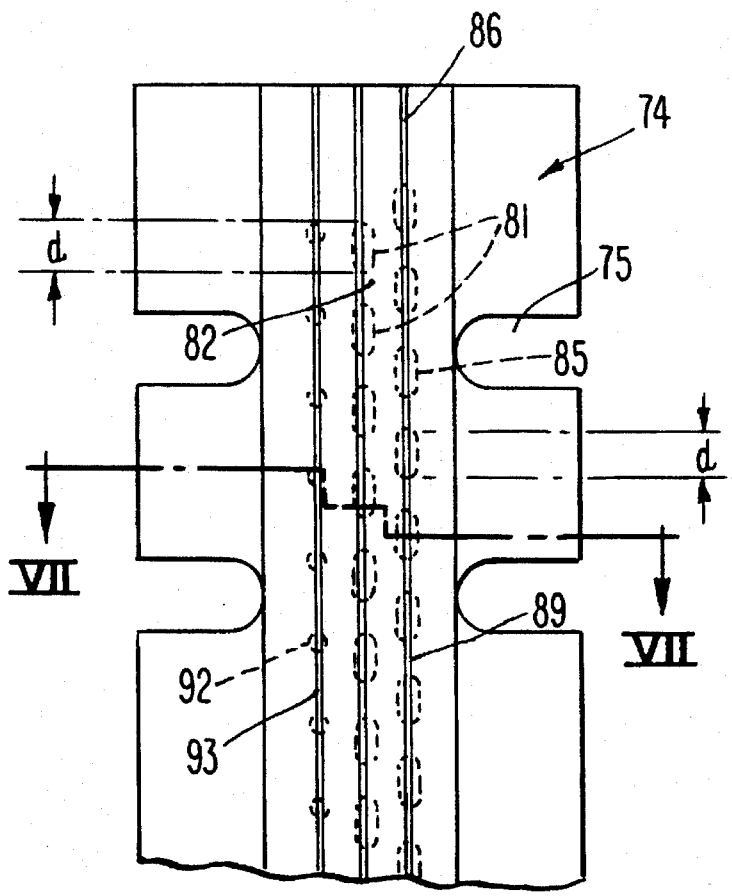
Figure 7:
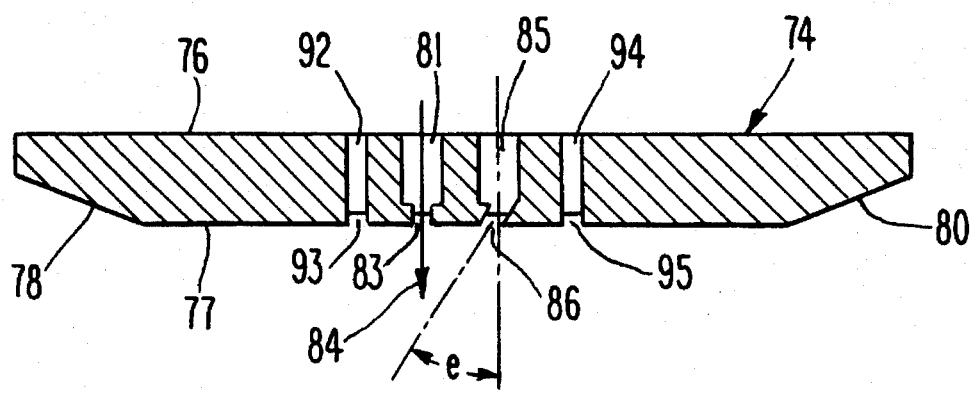
FIG. 7 is a longitudinal sectional view similar to that of FIG. 5 but taken generally along the line of VII—VII of FIG. 6.

With reference now to FIG. 6 and 7, the multi-port gas dispenser nozzle plates associated with the gas dispensing (generally air) station 16 are shown. Aside from the nozzle plates 74, the rest of the manifolds of dispensers of 20, 21 will generally be constructed along the lines of those 17,18, as aforesaid. Each nozzle plate 74, has a plurality of notches 75 which function as aforesaid for the notches 55 of the plate of FIG. 4. Additionally, each plate 74 likewise extends transversely of the apparatus between sidewalls 26, and has upper and lower surfaces 76, 77, and lower chamferred upstream and downstream surface portions 78, 80, pursuant to the embodiment discussed above.

However, the plate 74 is provided with a plurality of slotted holes 81 arranged in a transverse row along the plate 74, as shown. The slotted holes are separated by plurality of transverse spacings 82. The slotted holes 81 are connected by a transverse, groove 83 in the lower surface 77 of the plate 74. The groove 83 is perpendicular to the longitudinal path of flow of articles passing therebeneath, and is of a depth as measured upwardly from the surface 77 that is within a range of 1 to 4 times the width of the slotted holes 81 as measured in the longitudinal direction (shortest slotted hole dimension), when preferably sized.

The groove 83 facilitates maintaining the discharge of air or other gas through each of the slotted holes 81, to remain of a width that is evidenced by the dimension "d" in FIG. 6, so that air emanating downwardly therefrom as shown, in the direction of the arrow 84, perpendicular to the path 22 of flow of articles therebeneath will be in the form of a plurality of transversely spaced apart, transversely oriented, planar zones of gas flow.

A plurality of nozzles 85 are also provided in a transverse row, as shown in FIGS. 6 and 7, similarly comprising slotted holes spaced apart from each other as shown, also arranged to emanate therefrom, with respect to each slotted hole, a transversely spaced apart transverse, planar zone of gas flow directed toward the path of article travel, of transverse dimension "d". However, the direction of flow of the air or other gas emanating from the nozzles 85, has an upstream component of direction, because of the orientation provided by the angled cut "e" shown in FIG. 7, whereby the groove 86 is cut into the surface 77 at an angle "e", of approximately 30°.

Additionally, it will be noted that the slotted holes 85 in their row aligned with groove 86, are "staggered", relative to the slotted holes 81 in their row aligned with their groove 83, such that the slotted holes 85 are longitudinally aligned with spacings 82, and slotted holes 81 are longitudinally aligned with spacings 89. Thus an article being treated with air or other gas flow does not initially meet an unbroken singular screen of air as it passes beneath the slotted holes 81, but rather, sees a plurality of parallel vertical planar screens of air, and next sees a plurality of screens of air via the slotted holes 85, along longitudinal imaginary ribbons 90 of areas on the surface of the article being treated (see FIG. 2).

It will also be noted that in FIGS. 6 and 7, there is shown a plurality of cylindrical holes 92, connected by a groove 93 in the lower surface 77, which facilitate additional gas flow over the articles being treated. Additionally, another optional row of cylindrical holes 94 may be provided on the downstream end of the plate 94, extending perpendicular to the path of flow 22 of articles passing therebeneath, also connected by a transverse groove 95, as shown in FIG. 7. It will be noted that the holes 94 and grooves 95 are not shown in FIG. 6, in that the same are provided as an option, only.

Figure 8:
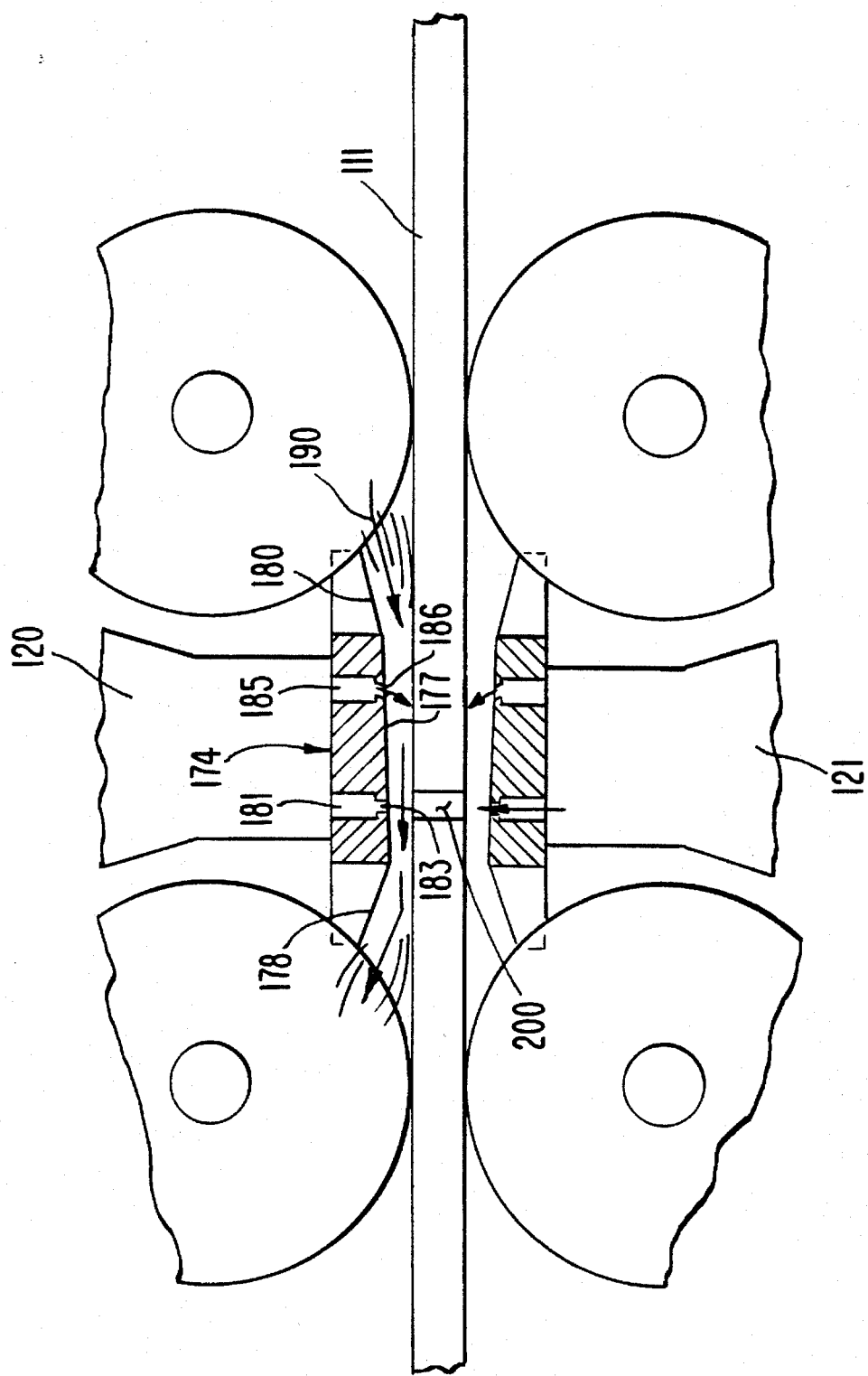
FIG. 8 is an enlarged fragmentary longitudinal sectional view taken through an alternative gas delivery pair of manifolds disposed on opposite sides of a path of travel of articles being treated, wherein the surfaces of the manifold plates closest to the path of travel are converging in an upstream direction to facilitate suction of fluid conveyed for impinging surfaces of articles being treated.

With reference now to FIG. 8, an alternative arrangement is provided for gas or other air discharge dispensers 120, 121, in the form of upper and lower nozzle plates 174 carried by associated manifolds. The rows of slotted holes 181, 185 and their respective lower grooves 183, 186 are essentially the same as those for the rows of slotted holes 81, 85 and associated grooves described above with respect to the embodiment of FIGS. 6 and 7, so the same will not be duplicated herein. However, it will be noted that the upstream orientation of air discharged via nozzle openings 185 and associated groove 186 creates a partial vacuum as shown by the arrow 190. The lower surface 177 of the plate 174 in this embodiment is sloped, rather than being parallel to the path of flow 22 of articles being conveyed therepast, such that it converges from a downstream portion 180 thereof toward an upstream portion 178 thereof. Such convergence increases the velocity of flow of air past a through-hole 200 in the article 111 being conveyed therepast. If the upper and lower slotted holes in upper and lower ones of the plates 174 are staggered transversely, such that a given hole is impinged upon by air being discharged from either an upper or lower slotted hole, but not both at the same time, a pumping action can be effected whereby air will pass either upwardly or downwardly through the slotted hole 200, but not in both directions at the same time. Such pumping action created by the relative placement of upper and lower slotted holes in upper and lower plates 174, at higher velocities caused by the converging surfaces 177, and angled discharge groove 186, facilitate moving fluid upwardly and downwardly through through-holes 200.

It will be apparent from the foregoing that various modifications may be made in the details of construction, as well as in the use and operation of the apparatus and method in accordance with this invention.

What is claimed is:

1. Apparatus for fluid treatment of articles being conveyed along a predetermined generally longitudinal path, comprising means for conveying articles along a pre-determined longitudinal path from an upstream direction toward a downstream direction, and:

(a) a first fluid dispenser manifold arranged generally transverse to said generally longitudinal path;

(b) a second fluid dispenser manifold arranged generally transverse to said generally longitudinal path;

(c) said first and second fluid dispenser manifolds being disposed generally opposite each other with the longitudinal article path therebetween;

(d) with said first and second fluid dispenser manifolds having respectively associated first and second multi-port fluid dispenser nozzle plates disposed generally transverse of and adjacent to said path, with one said nozzle plate on each side of said path and terminating in a nozzle plate surface nearest said path;

(e) with at least one of said first and second nozzle plates having at least one generally transverse row of nozzle openings for dispensing fluid from an associated said manifold therethrough, into contact with articles being conveyed along the predetermined path;

(f) transverse groove means extending transverse of said longitudinal path along said nozzle plate surface, connecting the nozzle openings in said nozzle plate surface nearest said path; and (g) with said row of nozzle openings and said transverse groove means cooperating to comprise means for providing transversely extending screen-like fluid flow from said nozzle openings.

2. The apparatus of claim 1, wherein a said nozzle plate has at least two generally transverse rows of nozzle openings, with openings in one said row together with their associated groove means being arranged to dispense fluid generally perpendicular to the predetermined longitudinal path of articles, for impingement of fluid flow onto articles being conveyed therepast, and with the openings in another row, together with their associated groove means being arranged to dispense fluid in an upstream angled direction along said path, for impingement of fluid flow onto articles being conveyed therepast.

3. The apparatus of claim 1, wherein said at least one of said first and second nozzle plates is provided with a plurality of transversely spaced notches; and with a plurality of article-engaging roller wheels being mounted on said apparatus for engagement with articles as they are conveyed therepast; with said wheels being partially disposed in said notches for clearance therewith.

4. The apparatus of claim 1, wherein at least one said fluid dispenser manifold is provided with means for adjustably positioning said dispenser manifold such that its nozzle openings are adjustably positionable relatively close to and relatively away from the path of article travel.

5. The apparatus of claim 1, with a plurality of article-engaging roller wheels being mounted on said apparatus for engagement with articles as they are conveyed therepast; wherein the path of article travel is generally horizontal; and wherein said roller wheels are adapted to engage an upper surface of an article being conveyed along the path of travel, and with means facilitating vertical movement of said roller wheels to accommodate articles of various thickness.

6. The apparatus of claim 1, wherein the path of article travel is generally horizontal, and wherein said first and second fluid dispenser means are disposed above and below said path of travel.

7. The apparatus of claim 1, wherein each said fluid dispenser nozzle plate includes a plurality of generally transverse rows of nozzle openings.

8. The apparatus of claim 1, wherein a said nozzle plate has at least two generally transverse rows of nozzle openings, with openings in one said row together with their associated groove means being arranged to dispense fluid generally perpendicular to the predetermined longitudinal path of articles, for impingement of fluid flow onto articles being conveyed therepast; and with the openings in another row together with their associated groove means being arranged to dispense fluid in an upstream angled direction, for impingement of fluid flow onto articles being conveyed therepast; wherein said at least one of said first and second nozzle plates is provided with a plurality of transversely spaced notches; and with a plurality of article-engaging roller wheels being mounted on said apparatus for engagement with articles as they are conveyed therepast; with said wheels being partially disposed in said notches for clearance therewith, wherein at least one said fluid dispenser manifold is provided with means for adjustably positioning said dispenser manifold such that its nozzle openings are adjustably positionable relatively close to and relatively away from the path of article travel; wherein the path of article travel is generally horizontal; and wherein said roller wheels are adapted to engage an upper surface of an article being conveyed along the path of travel; and with means facilitating vertical movement of said roller wheels to accommodate articles of various thickness; wherein each said fluid dispenser nozzle plate includes a plurality of generally transverse rows of nozzle openings; and wherein said first and second fluid dispenser means are disposed above and below said path of travel.

9. The apparatus of any one of claims 1–2, wherein said nozzle openings comprise means for disseminating generally cylindrical columns of liquid flow, and wherein said groove means comprises means for connecting said columns of liquid flow into a generally flat, transversely disposed, planar screen spray of liquid.

10. The apparatus of claim 9, wherein said nozzle openings comprise a plurality of generally cylindrical holes in each said row.

11. The apparatus of claim 9, wherein said nozzle openings each include a cylindrical taper in the range of 100° to 160° across the diameter thereof, and wherein said groove means has an included angle longitudinally measured, within the range of 30° to 90°.

12. The apparatus of claim 11, wherein said cylindrical taper is approximately 120° and said included angle for said groove means is approximately 60°.

13. The apparatus of any one of claims 1–2, wherein said nozzle openings and associated transverse groove means comprise means for disseminating therefrom, a plurality of transversely spaced apart transverse, planar, zones of gas flow, directed toward the path of article travel.

14. The apparatus of claim 13, wherein said nozzle openings comprise a plurality of transversely elongated slotted holes in each said row, separated by transverse spacings.

15. The apparatus of claim 14, wherein the transversely elongated slotted holes in each said row of a given fluid dispenser nozzle plate are longitudinally aligned with spacings between slotted holes in an adjacent row.

16. The apparatus of claim 14, wherein the depth of said groove means is within a range of 1 to 4 times the width of the slotted holes as measured in the longitudinal direction.

17. The apparatus of any one of claims 1–2, wherein the nozzle plate surface nearest said path, for at least one of said nozzle plates, converges toward said path in an upstream direction, and comprises means, in cooperation with said upstream angled direction of said groove means, for creating a suction effect of fluid impingement on an article being conveyed therepast.

18. A method of fluid treatment of articles being conveyed along a pre-determined generally longitudinal path, comprising the steps of conveying articles along a pre-determined longitudinal path from an upstream direction toward a downstream direction, and:

(a) providing a first fluid dispenser manifold arranged generally transverse to said generally longitudinal path;

(b) providing a second fluid dispenser manifold arranged generally transverse to said generally longitudinal path;

(c) disposing the first and second fluid dispenser manifolds generally opposite each other with the longitudinal article path therebetween;

(d) with said first and second fluid dispenser manifolds having respectively associated first and second multiport fluid dispenser nozzle plates; disposing the nozzle plates generally transverse of and adjacent to the path, with one nozzle plate on each side of path terminating in a nozzle plate surface nearest said path;

(e) with at least one of the first and second nozzle plates having at least one generally transverse row of nozzle openings for dispensing fluid; dispensing fluid from an associated said manifold therethrough the openings thereof, into contact with articles being conveyed along the predetermined path;

(f) providing transverse groove means extending transverse of said longitudinal path along said nozzle plate surface and connecting the nozzle openings in said nozzle plate surface nearest said path via said groove means; and (g) providing transversely extending screen-like fluid flow from said nozzle openings via the transverse groove means.

19. The method of claim 18, including the step of providing a said nozzle plate with at least two generally transverse rows of nozzle openings, with openings in one said row together with their associated groove means being arranged to dispense fluid generally perpendicular to the predetermined longitudinal path of articles, any impinging fluid flow onto articles being conveyed therepast, and with the openings in another row, together with their associated groove means being arranged to dispense fluid in an upstream angled direction along said path, and impinging fluid flow onto articles being conveyed therepast in an upstream angled direction.

20. The method of claim 18, including the step of providing at least one of said first and second nozzle plates with a plurality of transversely spaced notches; and mounting a plurality of article-engaging roller wheels on said apparatus for engagement with articles as they are conveyed therepast; with said wheels being partially disposed in said notches for clearance therewith.

21. The method of claim 18, wherein at least one said fluid dispenser manifold is provided with means for adjustably positioning said dispenser manifold such that its nozzle openings are adjustably positionable relatively close to and relatively away from the path of article travel, and adjustably positioning the nozzle openings relative to the path.

22. The method of claim 18, and mounting a plurality of article-engaging roller wheels on said apparatus for engagement with articles as they are conveyed therepast; wherein the path of article travel is generally horizontal; and engaging said roller wheels with an upper surface of an article being conveyed along the path of travel, with vertical movement of said roller wheels to accommodate articles of various thickness.

23. The method of claim 18, wherein the conveying of articles along the path of travel is generally horizontal, and wherein said first and second fluid dispenser means are disposed above and below said path of travel.

24. The method of claim 18, wherein each said fluid dispenser nozzle plate includes a plurality of generally transverse rows of nozzle openings.

25. The method of claim 18, including providing a said nozzle plate with at least two generally transverse rows of nozzle openings, with openings in one said row together with their associated groove means dispensing fluid generally perpendicular to the predetermined longitudinal path of articles, for impingement of fluid flow onto articles being conveyed therepast; and with the openings in another row together with their associated groove means dispensing fluid in an upstream angled direction, for impingement of fluid flow onto articles being conveyed therepast; wherein said at least one of said first and second nozzle plates is provided with a plurality of transversely spaced notches; and mounting a plurality of article-engaging roller wheels on said apparatus for engagement with articles as they are conveyed therepast; with said wheels being partially disposed in said notches for clearance therewith; providing at least one said fluid dispenser manifold with means for adjustably positioning said dispenser manifold and adjustably positioning its nozzle opening relatively close to and relatively away from the path of article travel; wherein the path of article travel is generally horizontal; and engaging said roller wheels with an upper surface of an article being conveyed along the path of travel; vertically moving said roller wheels to accommodate articles of various thickness; wherein each said fluid dispenser nozzle plate includes a plurality of generally transverse rows of nozzle openings; and disposing said first and second fluid dispenser means above and below said path of travel.

26. The method of any one of claims 18–19, and disseminating from said nozzle openings generally cylindrical columns of liquid flow, and connecting said columns of liquid flow, via said groove means, into a generally flat, transversely disposed, planar screen spray of liquid.

27. The method of claim 26, including the steps of providing said nozzle openings with a plurality of generally cylindrical holes in each said row.

28. The method of claim 26, including the steps of providing said nozzle openings with a cylindrical taper in the range of 100° to 160° across the diameter thereof, and providing said groove means with an included angle longitudinally measured, within the range of 30° to 90°.

29. The method of claim 28, including providing said cylindrical taper at approximately 120° and providing said included angle for said groove means at approximately 60°.

30. The method of any one of claims 18–19, including the steps of disseminating from said nozzle openings and associated transverse groove means, a plurality of transversely spaced apart transverse, planar, zones of gas flow, directed toward the path of article travel.

31. The method of claim 30, including the steps of providing for said nozzle openings, a plurality of transversely elongated slotted holes in each said row, separated by transverse spacings.

32. The method of claim 31, and longitudinally aligning the transversely elongated slotted holes in each said row of a given fluid dispenser nozzle plate with spacings between slotted holes in an adjacent row.

33. The method of claim 32, including providing a depth for said groove means within a range of 1 to 4 times the width of the slotted holes as measured in the longitudinal direction.

34. The method of any one of claims 18–19, and converging the nozzle plate surface nearest said path, for at least one of said nozzle plates, toward said path in an upstream direction, and creating, in cooperation with said upstream angled direction of said groove means, a suction effect of fluid impingement on an article being conveyed therepast.

* * * * *